US009165769B1

(12) United States Patent
Ban et al.

(10) Patent No.: US 9,165,769 B1

(45) Date of Patent: Oct. 20, 2015

(54) FINE PATTERN STRUCTURES HAVING BLOCK CO-POLYMER MATERIALS

(71) Applicant: SK hynix Inc., Icheon (KR)

(72) Inventors: Keun Do Ban, Yongin (KR); Cheol Kyu Bok, Pohang (KR); Myoung Soo Kim, Seongnam (KR); Jung Gun Heo, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 14/738,725

(22) Filed: Jun. 12, 2015

Related U.S. Application Data

(63) Continuation of application No. 14/247,039, filed on Apr. 7, 2014, now Pat. No. 9,082,718.

(30) Foreign Application Priority Data

Dec. 2, 2013 (KR) ........................ 10-2013-0148249

(51) Int. Cl.

| | |
|---|---|
| ***H01L 29/205*** | (2006.01) |
| ***H01L 33/00*** | (2010.01) |
| ***H01L 23/58*** | (2006.01) |
| ***H01L 23/04*** | (2006.01) |
| ***H01L 21/027*** | (2006.01) |
| ***H01L 21/033*** | (2006.01) |
| ***H01L 21/308*** | (2006.01) |

(52) U.S. Cl.

CPC ........ *H01L 21/0274* (2013.01); *H01L 21/0337* (2013.01); *H01L 21/3086* (2013.01)

(58) Field of Classification Search

CPC ............ H01L 21/0274; H01L 21/0337; H01L 21/3086; H01L 21/31144; H01L 21/76802; H01L 51/0043

USPC ..................... 257/91, 98, 629, 730, 750, 797, 257/E21.305, E21.582, E21.595; 216/47, 216/49

See application file for complete search history.

(56) References Cited

U.S. PATENT DOCUMENTS

| | | | | |
|---|---|---|---|---|
| 5,705,319 | A * | 1/1998 | Bae | G03F 7/00 257/E21.026 |
| 2009/0004603 | A1 * | 1/2009 | Bok | G03F 7/0035 430/314 |
| 2009/0042146 | A1 * | 2/2009 | Kim | B81C 1/00031 430/323 |
| 2009/0162795 | A1 * | 6/2009 | Lee | H01L 21/308 430/319 |
| 2009/0246961 | A1 * | 10/2009 | Heo | H01L 21/0337 438/706 |
| 2010/0075504 | A1 * | 3/2010 | Tomita | H01L 21/02057 438/706 |
| 2010/0170871 | A1 * | 7/2010 | Sone | G03F 7/0035 216/47 |
| 2010/0207301 | A1 * | 8/2010 | Suh | B29C 65/72 264/447 |
| 2010/0248153 | A1 * | 9/2010 | Lee | H01L 21/0337 430/312 |
| 2012/0067843 | A1 * | 3/2012 | Watanabe | B82Y 10/00 216/22 |
| 2015/0228475 | A1 * | 8/2015 | Ban | H01L 21/0271 216/49 |

FOREIGN PATENT DOCUMENTS

KR 10-2013-0054982 A 5/2013

* cited by examiner

*Primary Examiner* — Mohsen Ahmadi

(57) ABSTRACT

A fine pattern structure includes a layer having or including alternating protrusion portions and recess portions, polymer patterns disposed in recess regions formed by the recess portions, brush patterns disposed on top surfaces of the protrusion portions, and a block co-polymer layer including first polymer block patterns formed on the brush patterns and second polymer block patterns formed on the polymer patterns.

9 Claims, 12 Drawing Sheets

FINE PATTERN STRUCTURES HAVING BLOCK CO-POLYMER MATERIALS

CROSS-REFERENCE TO RELATED APPLICATION

This application is a continuation of U.S. patent application Ser. No. 14/247,039 filed on Apr. 7, 2014, entitled FINE PATTERN STRUCTURES HAVING BLOCK CO-POLYMER MATERIALS, which claims priority under 35 U.S.C 119(a) to Korea Application No. 10-2013-0148249, filed on Dec. 2, 2013, in the Korean Intellectual Property Office, the disclosures of which are hereby incorporated by reference in their entireties.

BACKGROUND

As the semiconductor industry continues to develop, many efforts have been focused on the fabrication of fine patterns for highly integrated circuits. For example, integrated circuits may include fine patterns having minimum feature sizes between 20 nanometers and 30 nanometers. New patterning techniques, along with current photolithography techniques, should be developed to realize such fine patterns.

SUMMARY

Embodiments of the present disclosure relate to semiconductor devices, and more particularly, to fine pattern structures having block co-polymer materials.

Various embodiments are directed to fine pattern structures having block co-polymer materials.

According to some embodiments, a fine pattern structure includes a layer including protrusion portions and recess portions which are alternately arrayed, buried polymer patterns filling recess regions disposed on the recess portions and located between the protrusion portions, brush patterns on the protrusion portions, and a block co-polymer layer phase-separated into first polymer block patterns on the brush patterns and second polymer block patterns on the buried polymer patterns.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

The following embodiments provide fine pattern structures. The fine pattern structures include a layer composed or formed of protrusion portions and recess portions that alternate in a horizontal direction and various patterns disposed on the protrusion portions of the layer. In some embodiments, the patterns are used as mask patterns.

The fine pattern structures may constitute or be utilized by memory devices or logic devices. For example, the memory devices may include dynamic random access memory (DRAM) devices, static random access memory (SRAM) devices, flash memory devices, magnetic random access memory (MRAM) devices, phase changeable random access memory (PcRAM) devices, resistive random access memory (ReRAM) devices or ferroelectric random access memory (FeRAM) devices, and so on, and the logic devices may include controllers, microprocessors, processors, and so on.

In the following embodiments, it will be understood that when an element is referred to as being located "on", "over", "above", "under", "beneath" or "below" another element, it can directly contact the other element or at least one element may also be disposed between the two elements.

Figure 1:
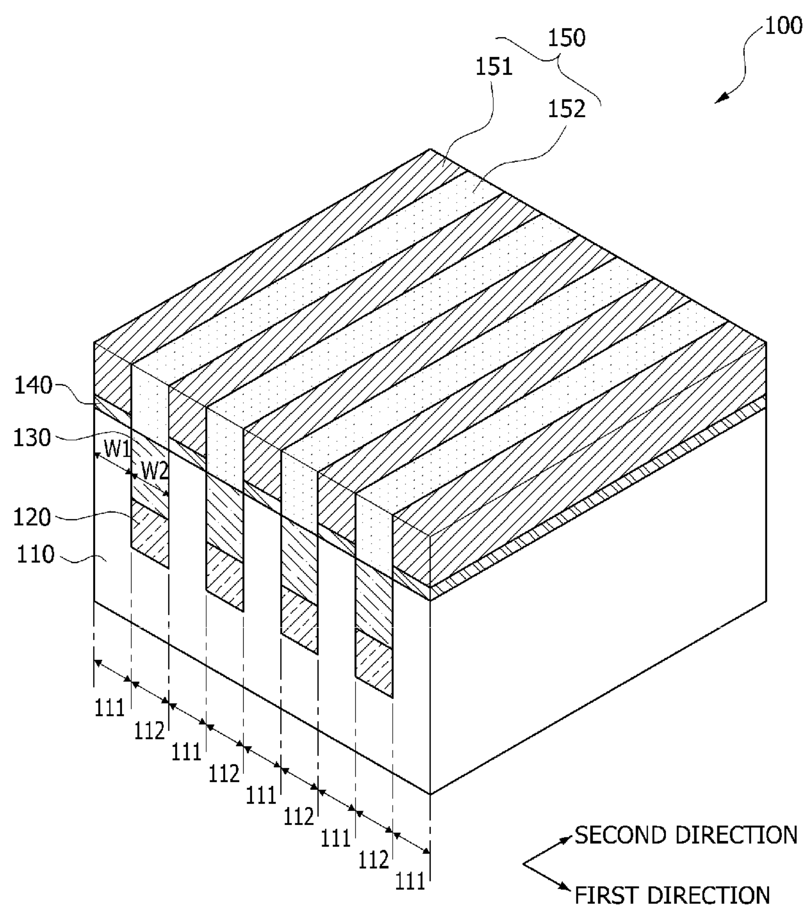
FIG. 1 is a perspective view illustrating a fine pattern structure according to some embodiments of the present disclosure.

Referring to FIG. 1, a fine pattern structure 100, according to some embodiments may include a layer 110 having protrusion portions 111 (or, pillars) and recess portions 112 (or, trenches), such as protrusion portions 111 and recess portions 112 that alternate in a first direction. The layer 110 may be a semiconductor substrate, such as a silicon substrate, and/or an insulation layer disposed on a substrate. The layer 110 may have a surface structure defined by the layout of the alternating protrusion portions 111 and recess portions 112. The protrusion portions 111 and the recess portions 112 may have a stripe shape extending in a second direction that is perpendicular to the first direction. For example, a width W1 of each protrusion portion 111 may be equal to a width W2 of each recess portion 112. However, in some embodiments, the width W2 of each recess portion 112 may be less than the width W1 of each protrusion portion 111. Recessed spaces, or regions, may be formed by or in the recess portions 112, and be located between the protrusion portions 111. Material patterns 120 may be disposed in lower regions of the recess regions. In some embodiments, the material patterns 120 may be polysilicon patterns doped with impurities and/or metal patterns. For example, the polysilicon patterns and/or the metal patterns may be used as buried electrode patterns.

The recess regions may be filled with polymer patterns 130, such as buried polymer patterns 130. For example, when the material patterns 120 are disposed in the lower regions of the recess regions, the polymer patterns 130 may be disposed on the material patterns 120. In some embodiments, top surfaces of the polymer patterns 130 may be coplanar with top surfaces of the protrusion portions 111.

In some embodiments, a block co-polymer (BCP) layer 150 is disposed on the polymer patterns 130 and the protrusion portions 111. The BCP layer 150 may include first polymer blocks 151 disposed on top surfaces of the protrusion portions 111 and second polymer blocks 152 disposed on the polymer patterns 130. The first polymer blocks 151 may be separated from the protrusion portions 111 by brush patterns 140 disposed between the protrusion portions 111 and the first polymer blocks 151.

The buried polymer patterns 130 may include a material that reacts with the second polymer blocks 152. In some embodiments, some or all of the buried polymer patterns 130 may include polymethylmethacrylate (PMMA) blocks. The brush patterns 140 may include a material that reacts with the first polymer blocks 151 thereon. In some embodiments, some or all of the brush patterns 140 may include polystyrene (PS) blocks. The brush patterns 140 may include terminal groups that chemically combine with the material that forms the layer 110. For example, when the layer 110 is a silicon layer, the brush patterns 140 may include PS blocks having terminal groups of hydroxyl groups (—OH).

The first polymer blocks 151 may be disposed such that they align with the brush patterns 140, and the second polymer blocks 152 may be disposed such that they align with the polymer patterns 130. Top surfaces of the first polymer blocks 151 may be coplanar with top surfaces of the second polymer blocks 152. The second polymer blocks 152 and the polymer patterns 130 may be selectively removed. After the second polymer blocks 152 and the polymer patterns 130 are selectively removed, the first polymer blocks 151 and the brush patterns 140 remaining on top surfaces of the protrusion portions 111 may be used as mask patterns protecting the top surfaces of the protrusion portions 111 when subsequent manufacturing processes (e.g., etching) are performed.

In some embodiments, the BCP layer 150 may include a polystyrene-polymethylmethacrylate (PS-PMMA) co-polymer. When the BCP layer includes the PS-PMMS co-polymer, the brush patterns 140 and the first polymer blocks 151 may be PS blocks, and the polymer patterns 130 and the second polymer blocks 152 may be PMMA blocks. In some embodiments, the BCP layer 150 may include a polybutadiene-polybutylmethacrylate co-polymer, a polybutadiene-polydimethylsiloxane co-polymer, a polybutadiene-polymethylmethacrylate co-polymer, a polybutadiene-polyvinylpyridine co-polymer, a polybutylacrylate-polymethylmethacrylate co-polymer, a polybutylacrylate-polyvinylpyridine co-polymer, a polyisoprene-polyvinylpyridine co-polymer, a polyisoprene-polymethylmethacrylate co-polymer, a polyhexylacrylate-polyvinylpyridine co-polymer, a polyisobutylene-polybutylmethacrylate co-polymer, a polyisobutylene-polymethylmethacrylate co-polymer, a polyisobutylene-polybutylmethacrylate co-polymer, a polyisobutylene-polydimethylsiloxane co-polymer, a polybutylmethacrylate-polybutylacrylate co-polymer, a polyethylethylene-polymethylmethacrylate co-polymer, a polystyrene-polybutylmethacrylate co-polymer, a polystyrene-polybutadiene copolymer, a polystyrene-polyisoprene co-polymer, a polystyrenepolydimethylsiloxane co-polymer, a polystyrene-polyvinylpyridine copolymer, a polyethylethylene-polyvinylpyridine co-polymer, a polyethylene-polyvinylpyridine co-polymer, a polyvinylpyridine-polymethylmethacrylate co-polymer, a polyethyleneoxidepolyisoprene co-polymer, a polyethyleneoxide-polybutadiene copolymer, a polyethyleneoxide-polystyrene co-polymer, a polyethyleneoxide-polymethylmethacrylate co-polymer, polyethyleneoxide-polydimethylsiloxane co-polymer, and/or a polystyrene-polyethyleneoxide co-polymer.

Various photolithography processes and apparatuses may be used when fabricating the fine structures described herein. An example photolithography apparatus used to form integrated circuit patterns, such as those described herein, may include a photoresist coater, an exposure unit, and a developer. Such a photolithography apparatus and accompanying processes may easily and effectively realize or develop integrated circuit patterns on a large areal substrate, with respect to uniformity, registration, overlay, and/or geometric layout of the integrated circuit patterns.

However, typical processes may suffer from limitations in achieving a desired pattern resolution R. The pattern resolution R may be expressed by the following equation (equation 1):

$$R=k1(\lambda/NA) \quad \text{(equation 1);}$$

where "λ" represents the wavelength of light used in the photolithography apparatus, "NA" represents a numerical aperture of a lens module used in the photolithography apparatus, and "k1" is a constant associated with process parameters. Thus, in order to improve the pattern resolution R, the wavelength λ or the constant value k1 could be reduced, or the numerical aperture NA could be increased. Attempts to reduce the wavelength λ have typically resulted in advanced photolithography processes that use light having a wavelength of about 193 nanometers to form fine patterns. In addition, e-beam lithography technologies or extreme ultraviolet (EUV) lithography technologies have been developed to form fine patterns having a critical dimension (CD), or a minimum feature size (MFS), of about 40 nanometers or less. For example, the EUV ray used in EUV lithography technologies has a short wavelength of about 13.5 nanometers. Thus, EUV lithography technologies seem useful candidates for next-generation lithography technologies. However, a EUV ray has high photon energy, and, therefore, the EUV ray may damage the EUV lithography apparatuses and it may be difficult to control the exposure energy absorbed in a photoresist layer used when forming the fine patterns.

Alternatively, photoresist materials exhibiting a low and stable line width roughness (LWR) have been developed to form nano-scale patterns. For example, chemically amplified resist (CAR) materials have been developed to provide nano-scale patterns. The CAR materials may induce the generation of acid in order to sensitively react to light. Accordingly, fine patterns having a minimum feature size of about 50 nanometers may be obtained using the CAR materials. However, previous attempts to use CAR materials to form fine patterns having a size less than 50 nanometers have suffered from process drawbacks (e.g., agglomerated polymer chains in the CAR materials, fast diffusion of acid molecules generated in the CAR materials, the collapsing of exposed CAR materials due to strong capillarity during development, and so on), leading to limitations in controlling a CD or a line edge roughness (LER) of the resist patterns.

The use of self-assembly of block co-polymer (BCP) materials in forming fine patterns may mitigate or solve one or more of the problems described herein. The BCP materials have a molecular structure that includes chemically distinct molecular chains (or polymer blocks) that combine with each other via covalent bonding and have a non-affinity between the molecular chains. Thus, fine phases or patterns may be formed due to the non-affinity between the molecular chains, such as phases having a range of sizes of 50 nanometers or less, 10 nanometers or less, and so on.

For example, an array structure (e.g., for use in lithography processes) of BCP materials may be formed on a large areal substrate that has different patterns that are alternately and repeatedly disposed. Because the self-assembly of the BCP materials used in formation of nano-scale patterns is achieved by a simple process, such as an annealing process, the fabrication cost of the nano-scale patterns may be reduced. Furthermore, since the chemical structures of the BCP materials are similar to the photoresist materials which are currently used in fabrication of semiconductor devices, the BCP materials may be easily adapted by fabrication processes of the semiconductor devices. Therefore, the BCP materials may assist in realizing interface layers between specific phases having widths of a few nanometers or less, and the LWR or the LER of the nano-scale patterns may be reduced, among other benefits.

FIGS. 2, 4, 6, 8, 10, 12, 14, 16 and 18 are plan views illustrating a method of fabricating a fine pattern structure. FIGS. 3, 5, 7, 9, 11, 13, 15, 17 and 19 are cross-sectional views taken along lines I-I' of FIGS. 2, 4, 6, 8, 10, 12, 14, 16 and 18, respectively.

Figure 2:
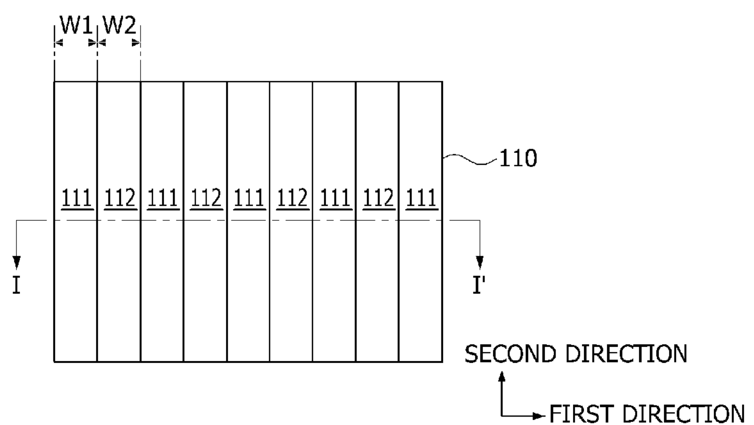
FIGS. 2 to 19 are schematic views illustrating a method of fabricating a fine pattern structure according to some embodiments of the present disclosure.
Figure 3:
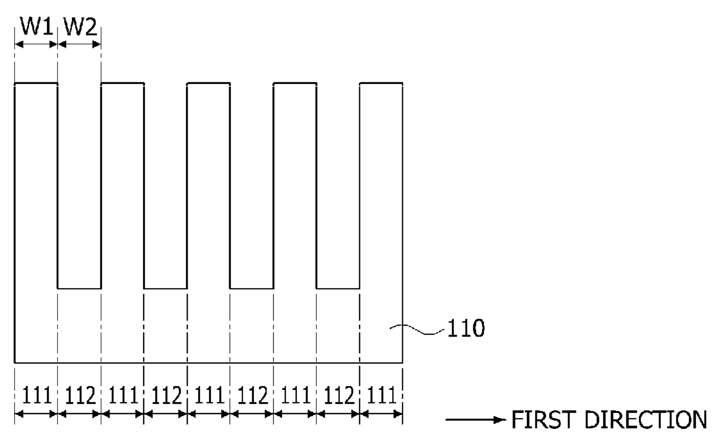

Referring to FIGS. 2 and 3, a layer 110 having protrusion portions 111 and recess portions 112 that alternate in a first direction is provided. The layer 110 may be a semiconductor substrate, such as a silicon substrate, or an insulation layer disposed on a substrate. For example, the layer 110 may have a surface layout of alternating protrusion portions 111 and recess portions 112. The protrusion portions 111 and the recess portions 112 may have a stripe shape extending in a second direction, which is perpendicular to the first direction. The width W1 of each protrusion portion 111 may be equal to a width W2 of each recession portion 112. However, in some embodiments, the width W2 of each recession portion 112 may be less than the width W1 of each protrusion portion 111. Recess spaces or regions may be formed by or within the recess portions 112 and/or be located between the protrusion portions 111.

Figure 4:
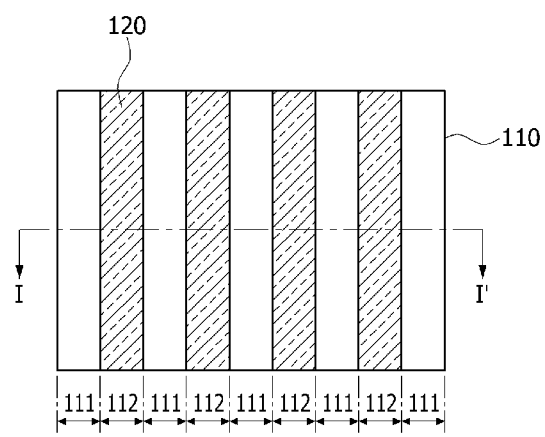
Figure 5:
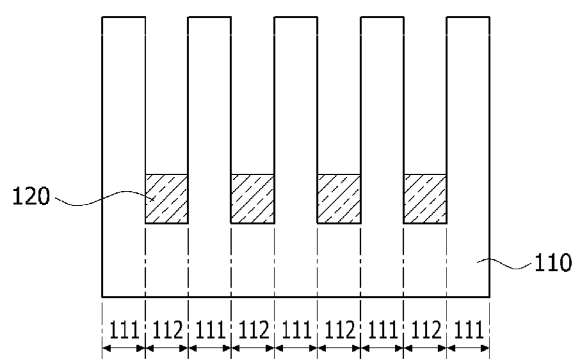

Referring to FIGS. 4 and 5, material patterns 120 may be formed or otherwise disposed in lower regions of the recess regions. In some embodiments, the material patterns 120 may be formed of a polysilicon layer doped with impurities and/or a metal layer. In some embodiments, forming the material patterns 120 may be omitted.

Figure 6:
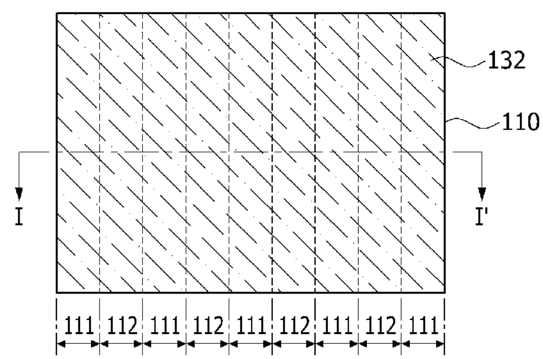
Figure 7:
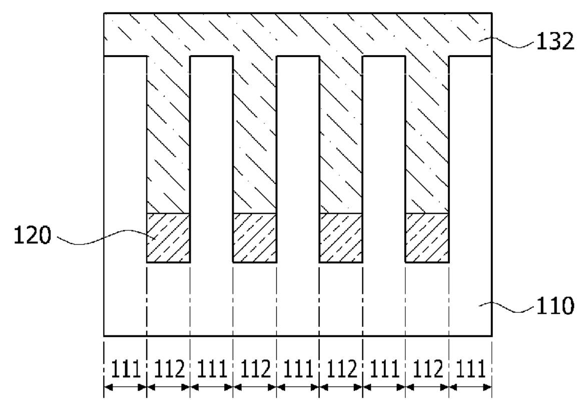

Referring to FIGS. 6 and 7, a polymer layer 132 may be formed or otherwise disposed on the layer 110 and the material patterns 120. The polymer layer 132 may be formed to fill the recessed regions and/or to cover the top surfaces of the protrusion portions 111. The polymer layer 132 may be formed using a coating process, such as a spin coating process, a dip coating process, and/or a spray coating process. For example, the polymer layer 132 may be formed by dissolving polymer materials in an appropriate organic solvent to form a solution, by coating the solution on the layer 110 and the material patterns 120 with a spin coating technique, and by baking the coated solution to remove the organic solvent.

In some embodiments, the polymer layer 132 is formed of the same or similar material as any material that forms a first polymer block and/or a second polymer block generated by a phase separation of a block co-polymer layer (150 of FIG. 15), which is formed in a subsequent process. For example, the polymer layer 132 may be formed of the material that forms the second polymer block. Alternatively, the polymer layer 132 may be formed of a material that reacts with the second polymer block. In some embodiments, when the block co-polymer layer (150 of FIG. 15) is formed of a polystyrene-polymethylmethacrylate (PS-PMMA) co-polymer material, the polymer layer 132 may be formed of a PMMA homopolymer material.

Figure 8:
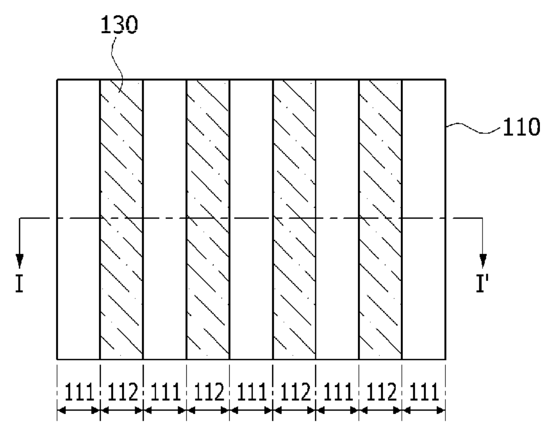
Figure 9:
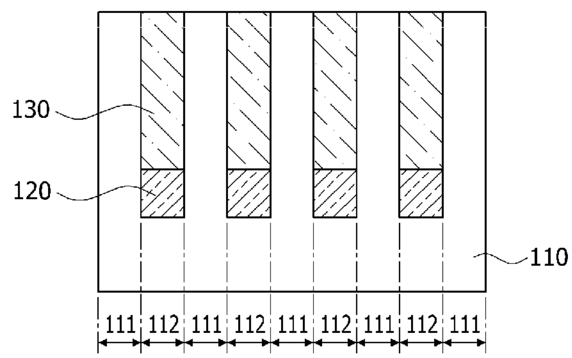

Referring to FIGS. 8 and 9, the polymer layer 132 is etched back using a dry etch process, to form buried polymer patterns 130 in the recess regions formed by the recess portions 112. The polymer layer 132 may be etched back until top surfaces of the protrusion portions 111 are exposed and/or partially exposed, resulting in the top surfaces of the buried polymer patterns 130 being substantially coplanar with the top surfaces of the protrusion portions 111. In some embodiments, the dry etch process for forming the buried polymer patterns 130 may be performed using an oxygen gas as a process gas. In such a case, the dry etch process may be performed in an inductive coupled plasma (ICP) apparatus and/or a capacitive coupled plasma (CCP) apparatus.

Figure 10:
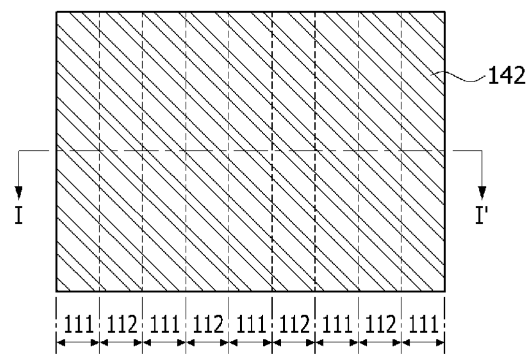
Figure 11:
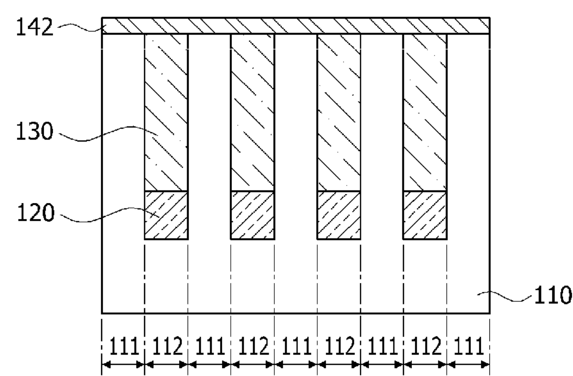

Referring to FIGS. 10 and 11, a brush layer 142 may be formed or otherwise disposed on the top surfaces of the protrusion portions 111 and the top surfaces of the buried polymer patterns 130. The brush layer 142 may be formed of the same material as the material of a first polymer block or the material of a second polymer block generated by a phase separation of a block co-polymer layer (150 of FIG. 15), which is formed in a subsequent process. For example, the brush layer 142 may include the polymer material of the first polymer block. Alternatively, the brush layer 142 may be formed of a material that reacts with the first polymer block. In some embodiments, when the block co-polymer layer (150 of FIG. 15) is formed of a polystyrene-polymethylmethacrylate (PS-PMMA) co-polymer material, the brush layer 142 may be formed of a PS homopolymer material.

The brush layer 142 may have terminal groups that chemically react and combine with the protrusion portions 111. For example, when the layer 110 including protrusion portions 111 is a silicon layer, the brush layer 142 may be formed of a hydroxyl terminated polystyrene (PS—OH) material having hydroxyl terminal groups (—OH). Thus, the brush layer 142 may chemically bond to the top surfaces of the protrusion portions 111, whereas the brush layer 142 does not bond to the top surfaces of the buried polymer patterns 130. The brush layer 142 may be formed using a coating process, for example, a spin coating process, a dip coating process, and/or a spray coating process. For example, the brush layer 142 may be formed by dissolving PS polymer materials in an appropriate organic solvent to form a solution, by coating the solution on the protrusion portions 111 and the buried polymer patterns 130 with a spin coating technique, and by baking the coated solution to remove the organic solvent.

Figure 12:
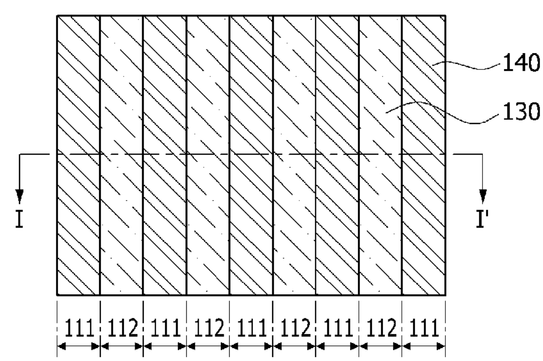
Figure 13:
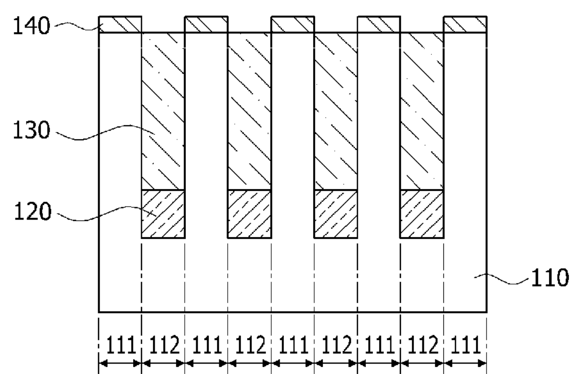

Referring to FIGS. 12 and 13, portions of the brush layer 142 may be selectively removed using an appropriate organic solvent. Because the portions of the brush layer 142 on the protrusion portions 111 are chemically bonded to the protrusion portions 111, the portions of the brush layer 142 on the protrusion portions 111 may remain, even though the brush layer 142 is exposed to the appropriate organic solvent. In contrast, because the remaining portions of the brush layer 142 on the buried polymer patterns 130 are not chemically bonded to the buried polymer patterns 130, the remaining portions of the brush layer 142 on the buried polymer patterns 130 may be selectively removed by the appropriate organic solvent. Therefore, when the brush layer 142 is exposed to the appropriate organic solvent, the portions of the brush layer 142 on the buried polymer patterns 130 are selectively removed to expose the buried polymer patterns 130 and to form brush patterns 140 on the top surfaces of the protrusion portions 111.

Figure 14:
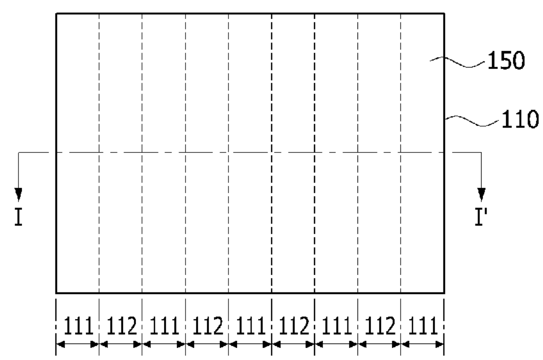
Figure 15:
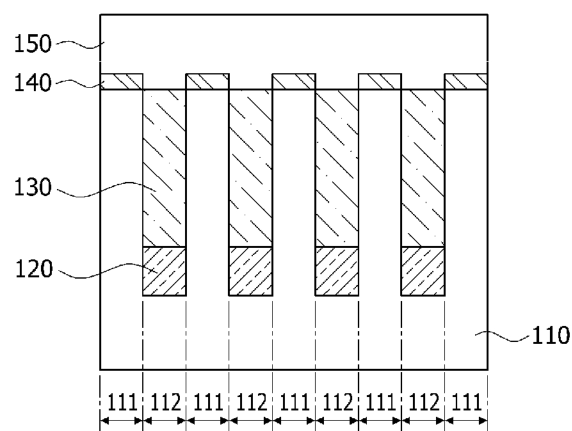

Referring to FIGS. 14 and 15, a block co-polymer (BCP) layer 150 may be formed or otherwise disposed on the brush patterns 140 and the buried polymer patterns 130. The BCP layer 150 may include two distinct polymeric chains, which combine together via covalent bonding. In some embodiments, the BCP layer 150 may be formed of a polystyrene-polymethylmethacrylate (PS-PMMA) co-polymer material, including PS blocks and PMMA blocks, as described herein. Alternatively, the BCP layer 150 may be formed of a polybutadiene-polybutylmethacrylate co-polymer material, a polybutadiene-polydimethylsiloxane co-polymer material, a polybutadiene-polymethylmethacrylate co-polymer material, a polybutadiene-polyvinyl pyridine co-polymer material, a polybutylacrylate-polymethylmethacrylate co-polymer material, a polybutylacrylate-polyvinylpyridine co-polymer material, a polyisoprene-polyvinylpyridine co-polymer material, a polyisoprene-polymethylmethacrylate co-polymer material, a polyhexylacrylate-polyvinylpyridine co-polymer material, a polyisobutylene-polybutylmethacrylate co-polymer material, a polyisobutylene-polymethylmethacrylate co-polymer material, a polyisobutylene-polybutylmethacrylate co-polymer material, a polyisobutylene-polydimethylsiloxane co-polymer material, a polybutylmethacrylate-polybutylacrylate co-polymer material, a polyethylethylene-polymethylmethacrylate co-polymer material, a polystyrene-polybutylmethacrylate co-polymer material, a polystyrene-polybutadiene co-polymer material, a polystyrene-polyisoprene co-polymer material, a polystyrene-polydimethylsiloxane co-polymer material, a polystyrene-polyvinylpyridine co-polymer material, a polyethylethylene-polyvinylpyridine co-polymer material, a polyethylene-polyvinylpyridine co-polymer material, a polyvinylpyridine-polymethylmethacrylate co-polymer material, a polyethyleneoxide-polyisoprene co-polymer material, a polyethyleneoxide-polybutadiene co-polymer material, a polyethyleneoxide-polystyrene co-polymer material, a polyethyleneoxide-polymethylmethacrylate co-polymer material, a polyethyleneoxide-polydimethylsiloxane co-polymer material, or a polystyrene-polyethyleneoxide co-polymer material.

Figure 16:
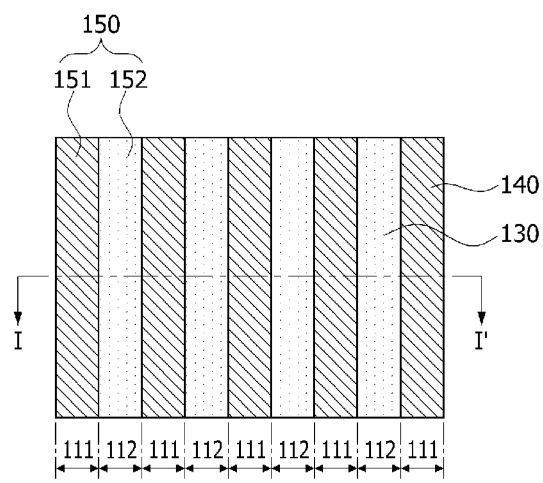
Figure 17:
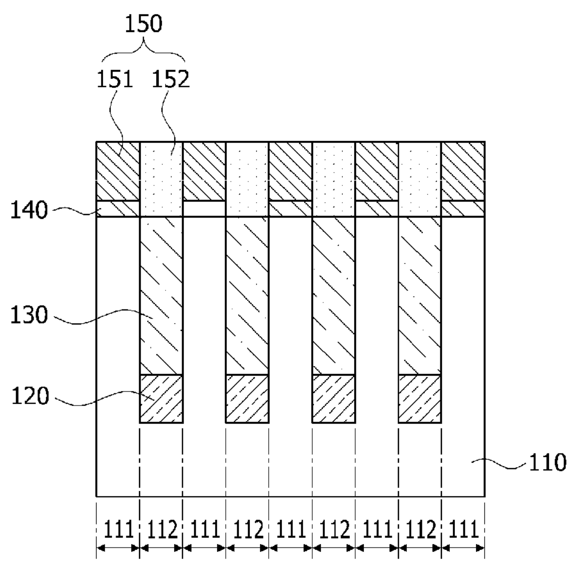

Referring to FIGS. 16 and 17, the BCP layer 150 may be annealed to phase-separate the polymeric chains which divides the layer 150 into first polymer block patterns 151 and second polymer block patterns 152. The first polymer block patterns 151 may align with the brush patterns 140. The second polymer block patterns 152 may align with the polymer patterns 130. Accordingly, the first polymer block patterns 151 and the second polymer block patterns 152 may alternate in the first direction (see FIGS. 2 and 3). When the BCP layer 150 is formed of a PS-PMMA co-polymer material and the brush patterns 140 and the polymer patterns 130 are formed of a PS material and a PMMA material respectively, the first polymer block patterns 151 may include PS blocks and the second polymer block patterns 152 may include PMMA blocks.

Figure 18:
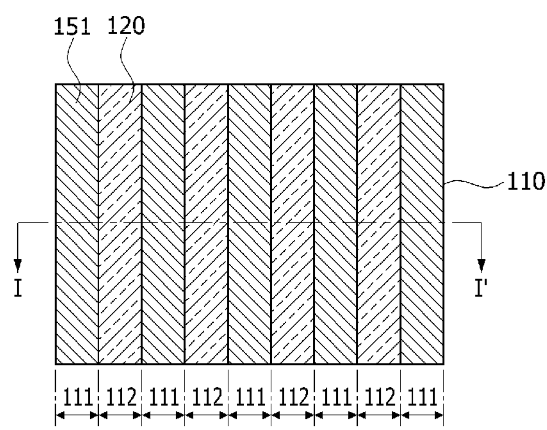
Figure 19:
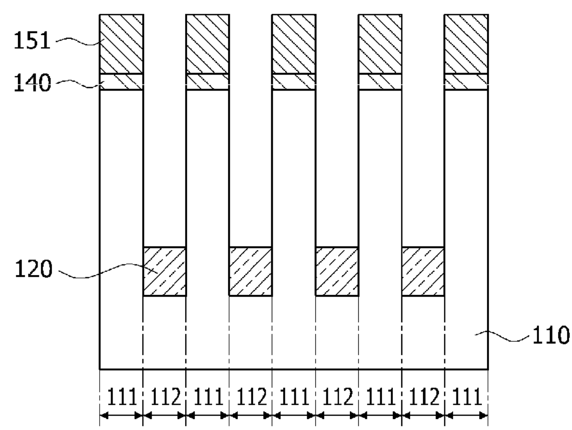

Referring to FIGS. 18 and 19, after the BCP layer 150 is phase-separated to form the first polymer block patterns 151 and the second polymer block patterns 152, the second polymer block patterns 152 and the polymer patterns 130 may be selectively removed. For example, when etch rates of the first and second polymer block patterns 151 and 152 are different from one another in a specific etching solution, the brush patterns 140 and the first polymer block patterns 151 stacked on the protrusion portions 111 will remain after the second polymer block patterns 152 and the polymer patterns 130 are removed by the etching solution. In some embodiments, the second polymer block patterns 152 and the polymer patterns 130 may be removed using a dry etch process or a wet etch process. Alternatively, the second polymer block patterns 152 and the polymer patterns 130 may be removed using an ultraviolet (UV) irradiation process.

Figure 20:
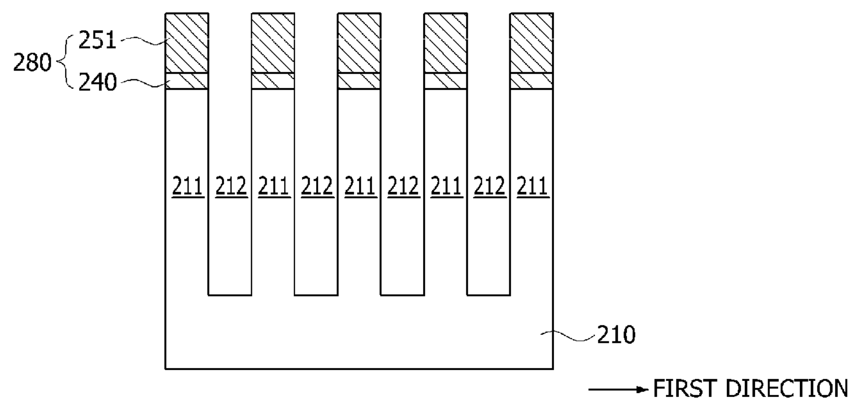
FIGS. 20, 21 and 22 are cross-sectional views illustrating an example of methods of fabricating semiconductor devices according to some embodiments of the present disclosure.
Figure 21:
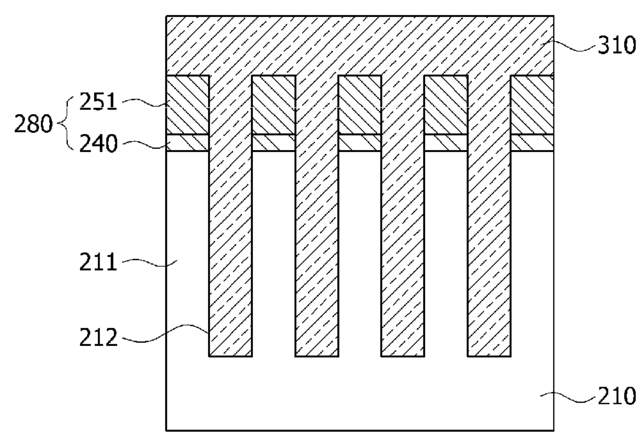
Figure 22:
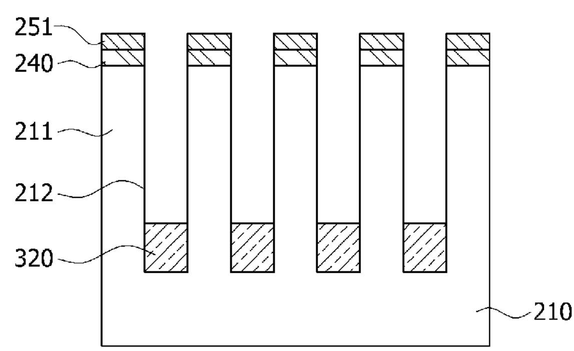

FIGS. 20, 21 and 22 are cross-sectional views illustrating an example of methods of fabricating semiconductor devices according to some embodiments of the present disclosure. As depicted in FIG. 20, a semiconductor substrate 210 is provided. The semiconductor substrate 210 includes pillars 211 and trenches 212, which alternate in a first direction. Etch mask patterns 280 may be formed on top surfaces of the pillars 211, and each of the etch mask patterns 280 may be formed to include a brush pattern 240 and a first polymer block pattern 251 stacked on the brush pattern 240.

The etch mask patterns 280 may be formed as described herein (e.g., the methods depicted in FIGS. 2 to 19). Thus, the brush patterns 240 and the first polymer block patterns 251 may be formed of a PS material. Subsequently, as depicted in FIG. 21, a metal electrode layer 310 may be formed or otherwise disposed on the etch mask patterns 280, to fill the trenches 212. As depicted in FIG. 22, buried metal electrode patterns 320 may be formed in the trenches 212 by etching back the metal electrode layer 310 using the etch mask patterns 280 as etch stop patterns. When the metal electrode layer

310 is etched back to form the buried metal electrode patterns 320, the etch mask patterns 280 may act or be utilized as etch stop patterns to protect the top surfaces of the pillars 211.

Figure 23:
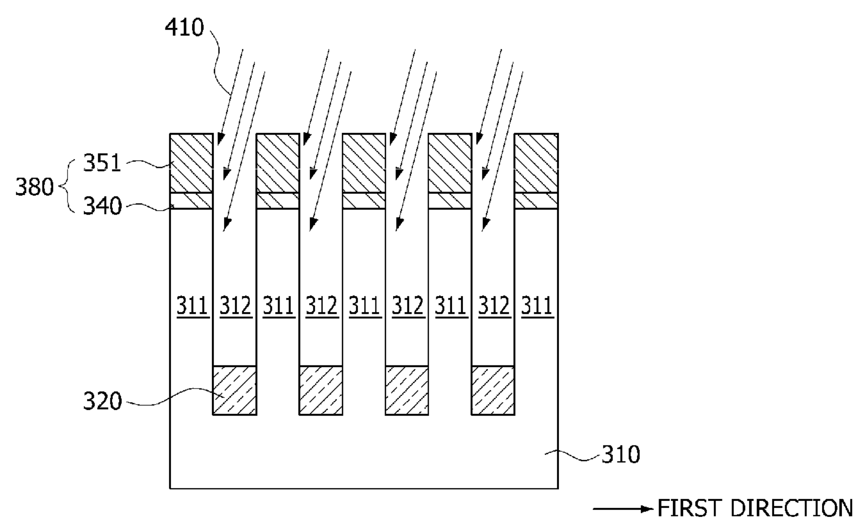
FIG. 23 is a cross-sectional view illustrating another example of methods of fabricating semiconductor devices according to some embodiments of the present disclosure.

FIG. 23 is a cross-sectional view illustrating another example of methods of fabricating semiconductor devices according to some embodiments of the present disclosure. Referring to FIG. 23, a semiconductor substrate 310 is provided. The semiconductor substrate 310 includes pillars 311 and trenches 312 that alternate in a first direction. Metal electrode patterns 320 may be formed or otherwise disposed in lower regions of the trenches 312, and ion implantation mask patterns 380 may be formed on top surfaces of the pillars 311. Each of the ion implantation mask patterns 380 may be formed to include a brush pattern 340 and a first polymer block pattern 351 stacked on the brush pattern 340. The ion implantation mask patterns 380 may be formed as described herein (e.g., the methods depicted in FIGS. 2 to 19). Thus, the brush patterns 340 and the first polymer block patterns 351 may be formed of a PS material. Subsequently, as indicated by arrows 410 in FIG. 23, a tilted ion implantation process may be applied to sidewalls of the pillars 311 that partially or fully form the trenches 312, to dope the pillars 311 that correspond to active regions with impurities. While the tilted ion implantation process is performed, the brush patterns 340 and the first polymer block patterns 351 may act as ion implantation masks to prevent top surfaces of the pillars 311 from being damaged by the tilted ion implantation process.

In some embodiments, the fine structures and methods described herein may be used in fabrication of integrated circuit (IC) chips. The IC chips may be supplied to users in a raw wafer form, in a bare die form, and/or in a package form. The IC chips may also be supplied in a single package form or in a multi-chip package form. The IC chips may be integrated in intermediate products, such as mother boards, and/or end products to constitute signal processing devices. The end products may include toys, low end application products, and/or high end application products, such as computers and mobile devices. For example, the end products may include display units, keyboards, smartphones, and/or central processing units (CPUs).

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the technology should be determined by the appended claims and their legal equivalents, not by the above description. All changes coming within the meaning and equivalency range of the appended claims are intended to be embraced therein.

Although a number of embodiments consistent with the technology have been described, it should be understood that numerous other modifications and embodiments can be devised by those skilled in the art that will fall within the spirit and scope of the principles of this disclosure. Particularly, numerous variations and modifications are possible in the component parts and/or arrangements, which are within the scope of the disclosure, the drawings and the accompanying claims. In addition to variations and modifications in the component parts and/or arrangements, alternative uses will also be apparent to those skilled in the art.

What is claimed is:

1. A fine pattern structure, the structure comprising:

a layer including alternating protrusion portions and recess portions;

polymer patterns disposed in recess regions of the recess portions;

brush patterns disposed on top surfaces of the protrusion portions; and a block co-polymer layer, the block co-polymer layer including first polymer block patterns disposed on the brush patterns and second polymer block patterns disposed on the polymer patterns, wherein top surfaces of the polymer patterns are coplanar with the top surfaces of the protrusion portions, wherein the first polymer block patterns are aligned with the brush patterns, and wherein the second polymer block patterns are aligned with the polymer patterns.

2. The fine pattern structure of claim 1, wherein the layer is a semiconductor layer or an insulation layer.

3. The fine pattern structure of claim 1, wherein a width of each of the recess portions is equal to or less than a width of each of the protrusion portions.

4. The fine pattern structure of claim 1, further comprising:

material patterns disposed under the polymer patterns in the recess regions of the recess portions.

5. The fine pattern structure of claim 4, wherein the material patterns include a metal pattern.

6. The fine pattern structure of claim 1, wherein the brush patterns include a material that chemically reacts with the first polymer block patterns; and wherein the polymer patterns include a material that chemically reacts with the second polymer block patterns.

7. The fine pattern structure of claim 1, wherein the brush patterns and the first polymer block patterns are polystyrene (PS) block patterns; and wherein the polymer patterns and the second polymer block patterns are polymethylmethacrylate (PMMA) block patterns.

8. The fine pattern structure of claim 1, wherein the layer includes a silicon (Si) and each of the brush patterns includes a polymer layer having hydroxyl terminal groups (—OH).

9. The fine pattern structure of claim 1, wherein the polymer patterns are buried polymer patterns.

* * * * *